(12) United States Patent
Byun et al.

(10) Patent No.: US 7,781,304 B2
(45) Date of Patent: Aug. 24, 2010

(54) SEMICONDUCTOR DEVICE HAVING TRENCH ISOLATION REGION AND METHODS OF FABRICATING THE SAME

(75) Inventors: Kyung-Mun Byun, Seoul (KR); Ju-Seon Goo, Suwon-si (KR); Sang-Ho Rha, Seoul (KR); Eun-Kyung Baek, Suwon-si (KR); Jong-Wan Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 145 days.

(21) Appl. No.: 12/216,820

(22) Filed: Jul. 11, 2008

(65) Prior Publication Data

US 2009/0020847 A1 Jan. 22, 2009

(30) Foreign Application Priority Data

Jul. 19, 2007 (KR) .................. 10-2007-0072458

(51) Int. Cl.
*H01L 21/76* (2006.01)
(52) U.S. Cl. .................. 438/427; 438/424; 257/E21.545
(58) Field of Classification Search .................. 438/424, 438/427; 257/E21.545
See application file for complete search history.

(56) References Cited

U.S. PATENT DOCUMENTS 6,905,941 B2   6/2005  Doris et al.

| 2004/0144749 | A1* | 7/2004 | Kim et al. | 216/13 |
| 2006/0189092 | A1* | 8/2006 | Sato et al. | 438/424 |
| 2007/0020879 | A1* | 1/2007 | Baek et al. | 438/424 |
| 2008/0166854 | A1* | 7/2008 | Shin et al. | 438/427 |

FOREIGN PATENT DOCUMENTS

| KR | 10-2002-0004729 | 1/2002 |
| KR | 10-2004-0074348 | 8/2004 |

* cited by examiner

*Primary Examiner*—Bradley K Smith
(74) *Attorney, Agent, or Firm*—Harness, Dickey & Pierce, P.L.C.

(57) ABSTRACT

A semiconductor device having a trench isolation region and methods of fabricating the same are provided. The method includes forming a first trench region in a substrate, and a second trench region having a larger width than the first trench region in the substrate. A lower material layer may fill the first and second trench regions. The lower material layer may be etched by a first etching process to form a first preliminary lower material layer pattern remaining in the first trench region and form a second preliminary lower material layer pattern that remains in the second trench region. An upper surface of the second preliminary lower material layer pattern may be at a different height than the first preliminary lower material layer pattern. The first and second preliminary lower material layer patterns may be etched by a second etching process to form first and second lower material layer patterns having top surfaces at substantially the same height. First and second upper material layer patterns may be formed on the first and second lower material layer patterns, respectively.

23 Claims, 5 Drawing Sheets

SEMICONDUCTOR DEVICE HAVING TRENCH ISOLATION REGION AND METHODS OF FABRICATING THE SAME

PRIORITY STATEMENT

This application claims the benefit of priority under 35 U.S.C. §119 from Korean Patent Application No. 10-2007-0072458, filed on Jul. 19, 2007, the contents of which are hereby incorporated herein by reference in its entirety.

BACKGROUND

1. Field

Example embodiments relate to a semiconductor device and methods of fabricating the same. Other example embodiments relate to a semiconductor device having a trench isolation region and methods of fabricating the same.

2. Description of Related Art

Isolation technology for electrically and/or structurally isolating discrete devices, such that the discrete devices are able to perform their designated functions without interference from neighboring devices, is used during the semiconductor fabrication process. In order to increase the integration degree of semiconductor devices, it is desirable to decrease the dimensions of a discrete device, and concurrently, the width and area of an isolation region between two neighboring devices. As such, isolation technology may determine the integration degree of semiconductor devices. Isolation technology may affect the reliability of the electrical performance of a device.

Trench isolation technology for the fabrication of semiconductor devices has been realized wherein isolation and insulation layers may be formed between devices by forming a trench region defining an active region and filling the trench region with an insulating material. An isolation region formed by trench isolation technology may be formed of a high-density plasma (HDP) oxide layer. As the integration density of a semiconductor device increases, the width of the trench region becomes narrower. As such, an aspect ratio of the trench region increases, making it difficult to fill the trench region with the HDP oxide layer without a void.

SUMMARY

Example embodiments relate to a semiconductor device and methods of fabricating the same. Other example embodiments relate to a semiconductor device having a trench isolation region and methods of fabricating the same.

Example embodiments provide a semiconductor device including an insulating material layer filled without a void in trench regions having different widths and methods of fabricating the same that prevents (or reduces) the likelihood of forming a void.

Example embodiments are directed to a semiconductor device having trench isolation regions. The device includes a first trench region and a second trench region, which may be disposed in a substrate. The second trench region may have a larger width than the first trench region. A first lower material layer pattern that partially fills the first trench region may be provided. A second lower material layer pattern having a top surface at substantially the same level (or height) as that of the first lower material layer pattern may be provided to partially fill the second trench region. A first upper material layer pattern may be disposed on the first lower material layer pattern to fill a remaining portion of the first trench region. A second upper material layer pattern may be disposed on the second lower material layer pattern to fill a remaining portion of the second trench region.

In example embodiments, the second lower material layer pattern may have a denser layer structure than the first lower material layer pattern.

In example embodiments, the first and second lower material layer patterns may include at least one spin-on-glass (SOG) layer or at least one flowable chemical vapor deposition (CVD) oxide layer. The first and second upper material layer patterns may be material layers having denser layer structures than the first and second lower material layer patterns. The first and second lower material layer patterns may be material layers having better (or desirable) gap-fill characteristics than the first and second upper material layer patterns. The first and second upper material layer patterns may include high-density plasma (HDP) oxide layers.

In example embodiments, the device may include an insulating liner provided on each inner wall of the first and second trench regions.

Other example embodiments are directed to a method of fabricating a semiconductor device having trench isolation regions. The method includes forming a first trench region and a second trench region in a substrate. The second trench region may have a larger width than the first trench region. A lower material layer that fills the first and second trench regions may be provided. The lower material layer may be etched by a first etching process to form a first preliminary lower material layer pattern remaining in the first trench region and a second preliminary lower material layer pattern that remains in the second trench region. The second preliminary lower material layer pattern may have an upper surface thereof at a different level (or height) than the first preliminary lower material layer pattern. The first and second preliminary lower material layer patterns may be etched by a second etching process to form first and second lower material layer patterns having top surfaces at substantially the same level (or height). First and second upper material layer patterns may be formed on the first and second lower material layer patterns, respectively.

In example embodiment, forming the lower material layer may include forming a flowable material layer on the substrate having the first and second trench regions, and curing the flowable material layer. The lower material layer may be formed of at least one SOG layer or at least one flowable CVD oxide layer. The lower material layer in the second trench region may be formed with a denser layer structure than that in the first trench region.

In example embodiments, the first etching process may be a process in which the lower material layer in the first trench region has a higher etch rate than that in the second trench region. If the lower material layer in the first trench region has a higher etch rate than that in the second trench region, the first etching process may be a wet etching process.

The second etching process may be a process in which the second preliminary lower material layer pattern has a higher etch rate than the first preliminary lower material layer pattern. The second etching process may be a process in which the first and second preliminary lower material layer patterns are reacted with an etchant to generate and remove a solid reaction product. The second etching process may be a process in which the reaction product is generated and removed. The process may be performed repeatedly.

The reaction product may be removed by heating to a temperature above room temperature. The reaction product may be removed by a chemical solution. The etchant of the second etching process may include vapor hydrofluoric acid (HF).

The second etching process may be performed using a catalyst with the etchant. The catalyst may include ammonia gas.

According to example embodiments, the first etching process may be a process in which the lower material layer in the second trench region has a higher etch rate than that in the first trench region. The first etching process may be a process in which the lower material layer is reacted with an etchant to generate and remove a solid reaction product. The first etching process may be a process in which the reaction product is generated and removed. The process may be performed more than once (repeatedly). The reaction product may be removed by heating to a temperature above room temperature. The reaction product may be removed using a chemical solution. The etchant of the first etching process may include vapor hydrofluoric acid (HF). The first etching process may be performed using a catalyst with the etchant. The catalyst may include ammonia gas.

The second etching process may be a process in which the first preliminary lower material layer pattern has a higher etch rate than the second preliminary lower material layer pattern. If the first preliminary lower material layer pattern has a higher etch rate than the second preliminary lower material layer pattern, the second etching process may be a wet etching process.

The method may include forming an insulating liner on each inner wall of the first and second trench regions, after forming the first and second trench regions.

The first and second upper material layer patterns may be formed of a material having a denser layer structure than the first and second lower material layer patterns.

The lower material layer may be formed of a material having desirable (or increased) gap-fill characteristics than the first and second upper material layer patterns. The first and second upper material layer patterns may be formed of a material having a higher etch resistance than the lower material layer.

BRIEF DESCRIPTION OF THE DRAWINGS

Example embodiments will be more clearly understood from the following detailed description taken in conjunction with the accompanying drawings.

FIGS. 1A through 1F are diagrams illustrating cross-sectional views of a method of fabricating a semiconductor device according to example embodiments.

FIGS. 2A and 2B are diagrams illustrating cross-sectional views of a method of fabricating a semiconductor device according to example embodiments.

FIG. 3 is a flowchart schematically illustrating a method of fabricating a semiconductor device according to example embodiment.

DETAILED DESCRIPTION OF EXAMPLE EMBODIMENTS

Figure 1A:
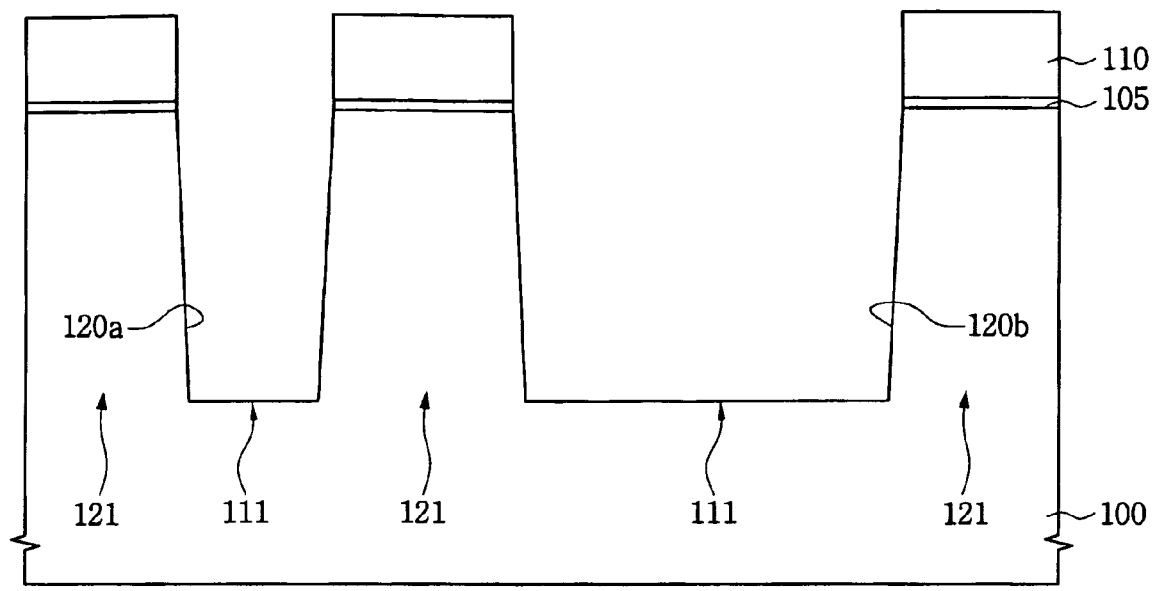
FIGS. 1A-1F, 2A, 2B and 3 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a semiconductor device and methods of fabricating the same. Other example embodiments relate to a semiconductor device having a trench isolation region and methods of fabricating the same.

Figure 3:
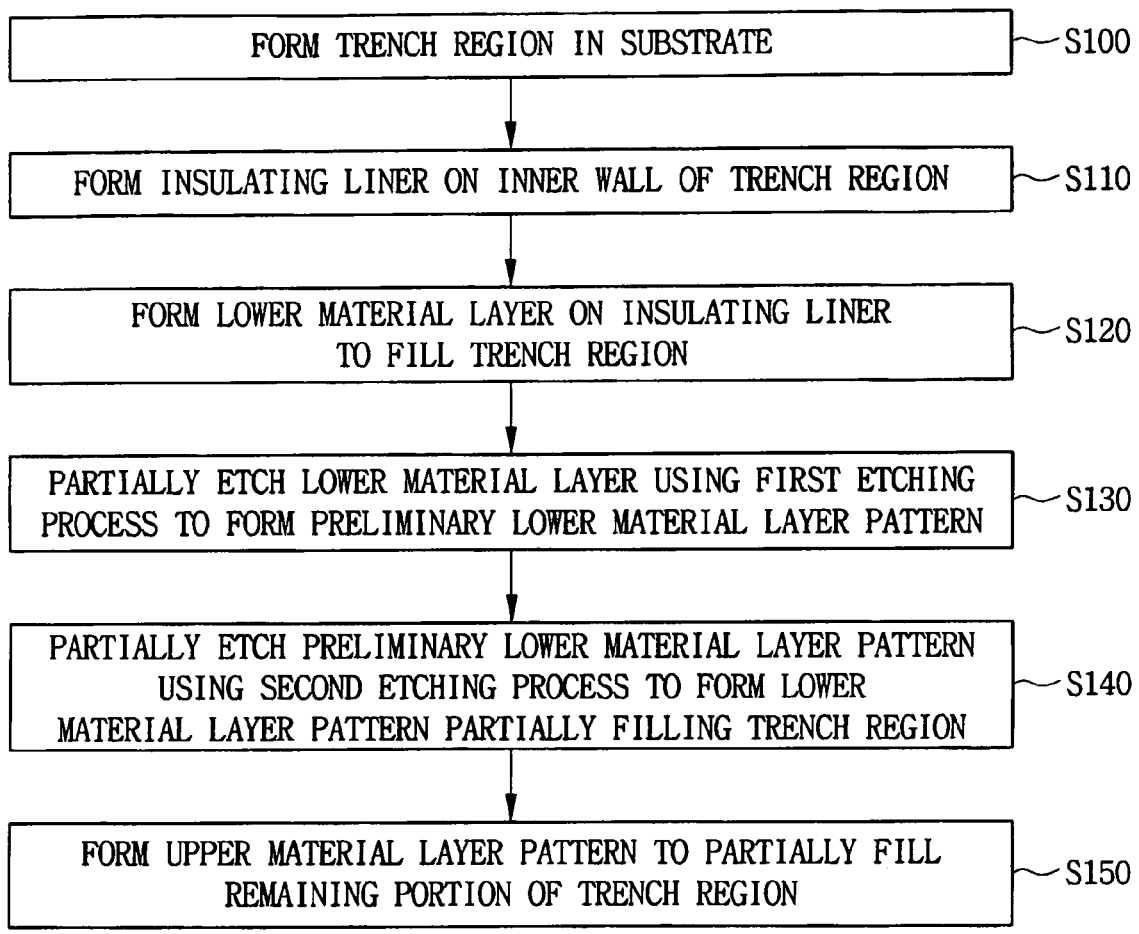

FIGS. 1A through 1F are diagrams illustrating cross-sectional views of a method of fabricating a semiconductor device according to example embodiments. FIG. 3 is a flowchart schematically illustrating a method of fabricating a semiconductor device according to example embodiments.

A semiconductor device fabricated according to example embodiment will now be described with reference to FIG. 1F.

Figure 1B:
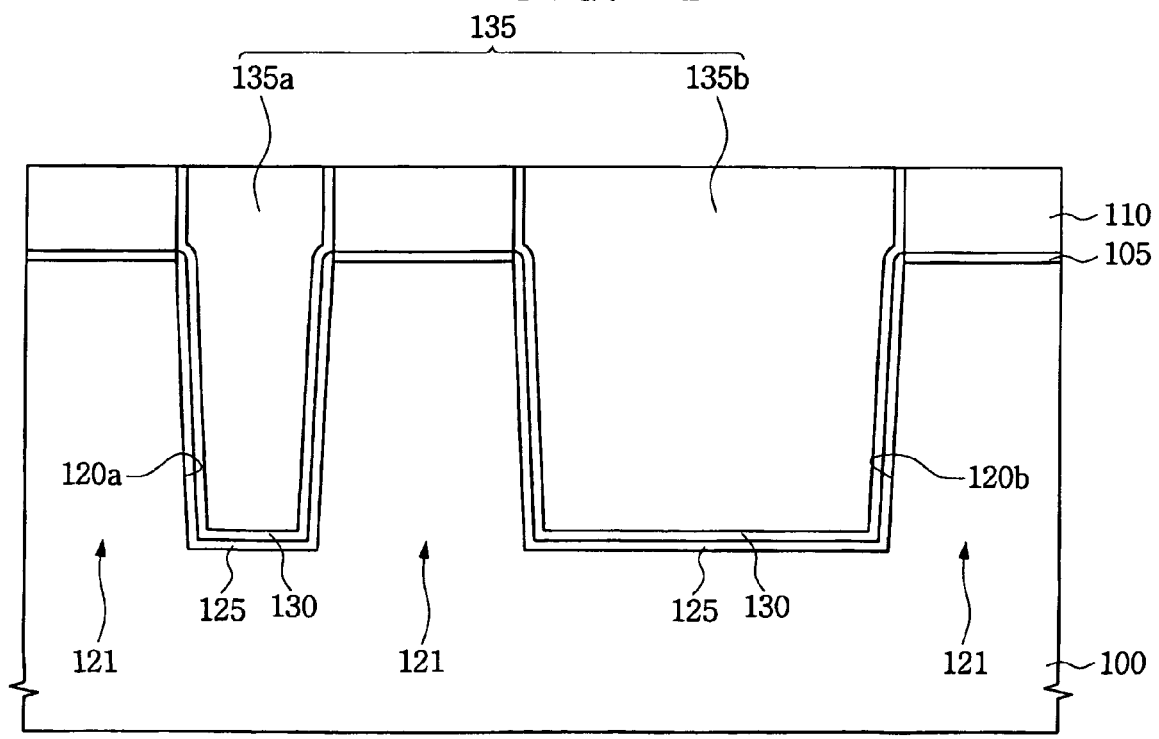
Figure 1C:
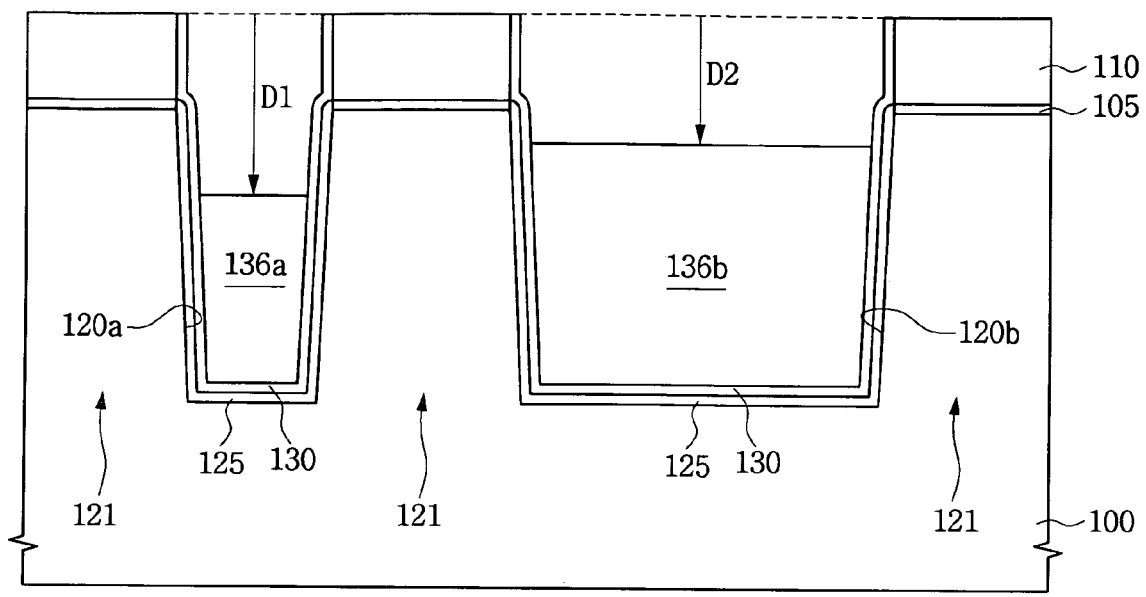
Figure 1D:
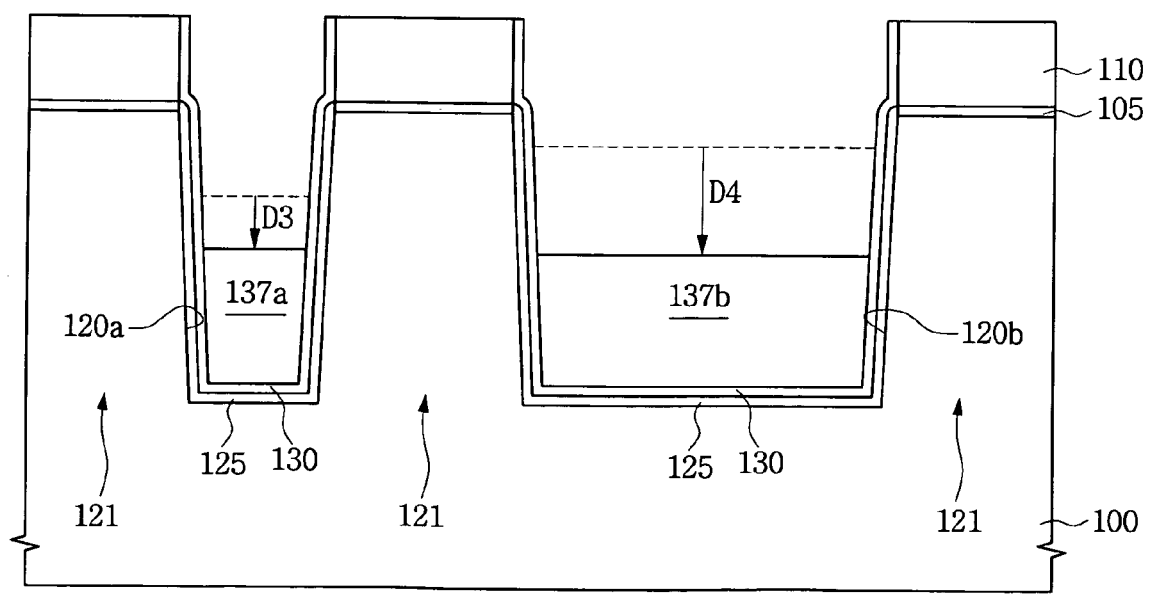
Figure 1E:
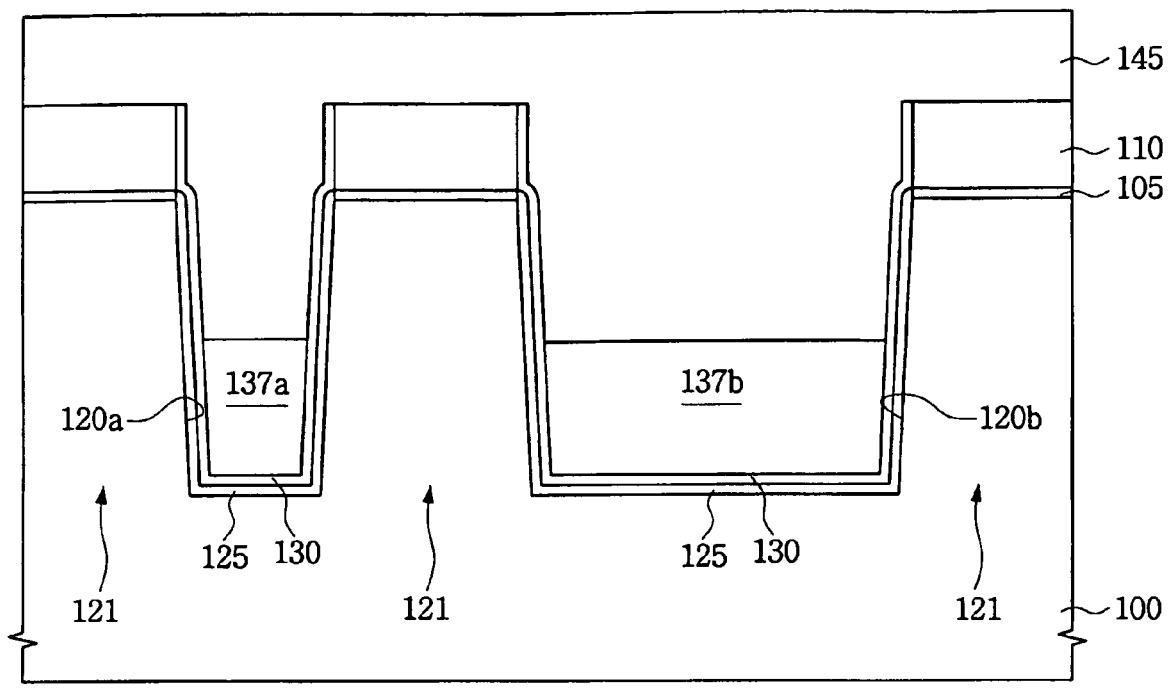
Figure 1F:
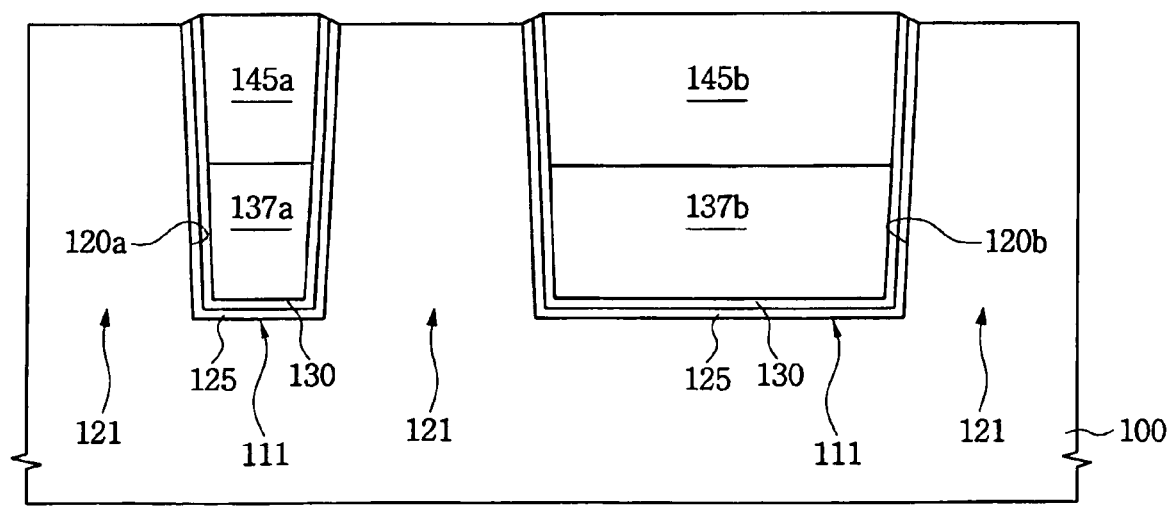

Referring to FIG. 1F, a substrate 100 having an active region 121 and a field region 111 may be provided. First and second trench regions 120a and 120b having different widths may be provided in the field region 111 of the substrate 100. The second trench region 120b may have a larger width than the first trench region 120a. The first trench region 120a may have a higher aspect ratio than the second trench region 120b. An active region 121 of the substrate 100 may be defined by the first and second trench regions 120a and 120b.

A first lower material layer pattern 137a may be provided to partially fill the first trench region 120a. A second lower material layer pattern 137b having a top (or upper) surface at substantially the same level (or height) as that of the first lower material layer pattern 137a may be provided to partially fill the second trench region 120b. The second lower material layer pattern 137b may have a denser layer structure than the first lower material layer pattern 137a. The first and second lower material layer patterns 137a and 137b may be formed of at least one spin-on-glass (SOG) layer or at least one flowable chemical vapor deposition (CVD) oxide layer.

A first upper material layer pattern 145a may be disposed on the first lower material layer pattern 137a to fill a remaining portion of the first trench region 120a. A second upper material layer pattern 145b may be disposed on the second lower material layer pattern 137b to fill a remaining portion of the second trench region 120b. The first and second upper material layer patterns 145a and 145b may have substantially the same thickness. The first and second upper material layer patterns 145a and 145b may be material layers having denser layer structures than the first and second lower material layer patterns 137a and 137b. The first and second upper material layer patterns 145a and 145b may include material layers having a higher etch resistance than the first and second lower material layer patterns 137a and 137b. The first and second lower material layer patterns 137a and 137b may be material layers having better gap-fill characteristics than the first and second upper material layer patterns 145a and 145b. For example, if the first and second lower material layer patterns 137a and 137b are formed of material layers (e.g., SOG layers), the first and second upper material layer patterns 145a and 145b may be formed of high-density plasma (HDP) oxide layers.

An insulating liner 130 may be provided to cover (or along) inner walls of the first and second trench regions 120a and 120b. The insulating liner 130 may be interposed between the first lower material layer pattern 137a and the inner wall of the first trench region 120a. The insulating liner 130 may be between the first upper material layer pattern 145a and the inner wall of the first trench region 120a. As such, the first upper material layer pattern 145a may be stacked on the first lower material layer pattern 137a. The insulating liner 130 may be interposed between the second lower material layer pattern 137b and the inner wall of the second trench region 120b. The insulating liner 130 may be between the second upper material layer pattern 145b and the inner wall of the second trench region 120b. As such, the second upper material layer pattern 145b may be stacked on the second lower material layer pattern 137b. The insulating liner 130 may be provided on the inner walls of the first and second trench regions 120a and 120b without etching damage. The insulating liner 130 may be provided (or formed) with a substantially uniform thickness.

The insulating liner 130 may have an etch selectivity with respect to the first and second lower material layer patterns 137a and 137b. The insulating liner 130 may have an etch selectivity with respect to the first and second upper material layer patterns 145a and 145b. For example, the insulating liner 130 may be formed of a silicon nitride layer. A buffer insulating layer 125 may be provided between the inner wall of the first trench region 120a and the insulating liner 130. The buffer insulating layer 125 may be between the inner wall of the second trench region 120b and the insulating liner 130. The buffer insulating layer 125 may be a thermal oxide layer.

As described above, the first and second lower material layer patterns 137a and 137b, which have good (or desirable) gap-fill characteristics and the top surfaces that are at substantially the same level (or height), may partially fill the first and second trench regions 120a and 120b, respectively. The first and second upper material layer patterns 145a and 145b, which have a higher etch resistance than the first and second lower material layer patterns 137a and 137b and a substantially uniform thickness, may fill the remaining portions of the first and second trench regions 120a and 120b, respectively. As such, the first and second trench regions 120a and 120b may be filled with insulating layers (e.g., the first and second lower material layer patterns 137a and 137b and the first and second upper material layer patterns 145a and 145b) without a void. Because upper portions of the first and second trench regions 120a and 120b may be protected by the first and second upper material layer patterns 145a and 145b having a substantially uniform thickness and high etch resistance, etching damage to the trench isolation regions may be prevented (or reduced) in subsequent processes.

A method of fabricating a semiconductor device according to example embodiments will now be described with reference to FIGS. 1A-1F and FIG. 3.

Referring to FIGS. 1A and 3, a substrate 100 having an active region 121 and a field region 111 may be prepared. The substrate 100 may be a silicon substrate. A pad insulating layer 105 and a mask pattern 110, which are sequentially stacked, may be formed on a desired region of the substrate 100. The pad insulating layer 105 and the mask pattern 110, which are sequentially stacked, may be formed on an active region 121 of the substrate 100. The mask pattern 110 may be formed of a silicon nitride layer. The pad insulating layer 105 may relieve a thermal stress due to the difference in thermal expansion coefficient between the substrate 100 and the mask pattern 110. The pad insulating layer 105 may be formed of a thermal oxide layer.

The field region 111 of the substrate 100 may be etched using the mask pattern 110 as an etch mask to form first and second trench regions 120a and 120b having different widths (S100). An active region 121 of the substrate 100 may be defined by the first and second trench regions 120a and 120b. Etching the substrate 100 using the mask pattern 110 as an etch mask may be performed by a dry etching process. The first trench region 120a may have a smaller width than the second trench region 120b. That is, the first trench region 120a having a higher aspect ratio than the second trench region 120b may be formed.

The first and second trench regions 120a and 120b may be formed in an inverted trapezoidal shape in which an upper portion has a larger width than a lower portion. However, the shape is not limited to the inverted trapezoidal shape. The first and second trench regions 120a and 120b may be formed in various shapes (e.g., a trapezoidal shape in which an upper portion has a smaller width than a lower portion, and a rectangular shape in which an upper portion has substantially the same width as a lower portion). The first and second trench regions 120a and 120b be may have the same shape. In other example embodiments, the first and second trench regions 120a and 120b may have different shapes.

Referring to FIGS. 1B and 3, a buffer insulating layer 125 may be formed on the substrate having the first and second trench regions 120a and 120b. The buffer insulating layer 125 may be formed by treating the substrate having the first and second trench regions 120a and 120b using a thermal oxide process. Etching damage of the substrate 100 caused during the formation of the first and second trench regions 120a and 120b may be reduced (or prevented) by forming the buffer insulating layer 125.

An insulating liner 130 may be formed on the substrate 100 having the buffer insulating layer 125 (S100). Oxidation of the substrate 100 having the active region 121 that occurs in subsequent thermal processes may be suppressed by the insulating liner 130. The insulating liner 130 may be formed of a material having an etch selectivity with respect to the buffer insulating layer 125. The insulating liner 130 may be formed of a silicon nitride layer using a chemical vapor deposition method.

A lower material layer 135 may be formed on the insulating liner 130 to fill the first and second trench regions 120a and 120b (S120). The portion of the lower material layer 135 in the first trench region 120a may be defined as a first lower material layer 135a. The portion of the lower material layer 135 in the second trench region 120b may be defined as a second lower material layer 135b. The second lower material layer 135b may be formed with a denser layer structure than the first lower material layer 135a.

Forming the lower material layer 135 may include forming a flowable material layer on the substrate 100 having the insulating liner 130, and curing the flowable material layer. The cured flowable material layer may be planarized to form the first lower material layer 135a remaining in the first trench region 120a and the second lower material layer 135b remaining in the second trench region 120b.

The lower material layer 135 may be formed of at least one SOG layer or at least one flowable CVD oxide layer. The lower material layer 135 may be formed of an organic SOG layer or an inorganic SOG layer. The lower material layer 135 may be formed of a polysilazane-based inorganic SOG layer. A liquid solution containing an SOG material and a solvent may be spin-coated on the substrate 100 having the insulating liner 130. The solvent contained in the spin-coated liquid solution may be removed and the spin-coated liquid solution may be solidified to form the lower material layer 135 by treating the spin-coated liquid solution using a thermal process. The spin-coated liquid solution in the second trench region 120b may have more SOG materials per unit volume than the spin-coated liquid solution in the first trench region 120a. The second lower material layer 135b may have a denser layer structure than the first lower material layer 135a. The thermal process may include pre-baking the spin-coated liquid solution at a higher first temperature than room temperature, and baking the spin-coated liquid solution at a second temperature higher than the first temperature. The thermal process may be performed in a process environment of oxidant and/or inert gas. For example, the pre-baking process may be performed at a temperature of 50° C. to 350° C., or about 50° C. to about 350° C. The baking process may be performed in an environment of at least one gas selected from the group consisting of oxygen, hydrogen, nitrogen, water and combinations thereof. The baking process may be performed at a temperature of 600° C. to 1200° C., about 600° C. to about 1200° C.

Referring to FIGS. 1C and 3, the lower material layer 135 may be partially etched by performing a first etching process to form a first preliminary lower material layer pattern 136a remaining in the first trench region 120a, and a second preliminary lower material layer pattern 136b remaining in the second trench region 120b (S130). The first etching process may be performed using a liquid etchant. The first etching process may be a process of etching the lower material layer 135 without (or with reduced) etching damage to the insulating liner 130 and the mask pattern 110. The first etching process may be a wet etching process using a buffered oxide etchant (BOE) or a diluted hydrofluoric acid (HF) etching solution.

The second lower material layer 135b may have a denser layer structure than the first lower material layer 135a. The second lower material layer 135b may be etched less than the first lower material layer 135a during the first etching process. The first lower material layer 135a may be recessed by a first distance D1 from a top surface of the mask pattern 110 to form the first preliminary lower material layer pattern 136a in the first trench region 120a. The second lower material layer 135b may be recessed by a second distance D2 from the top surface of the mask pattern 110 to form the second preliminary lower material layer pattern 136b in the second trench region 120b by the first etching process. The second distance D2 may be less than the first distance D1. The first preliminary lower material layer pattern 136a may have a top (or upper) surface at a level (or height) lower than the second preliminary lower material layer pattern 136b.

Referring to FIGS. 1D and 3, the first and second preliminary lower material layer patterns 136a and 136b may be partially etched by a second etching process to form a first lower material layer pattern 137a in the first trench region 120a and a second lower material layer pattern 137b in the second trench region 120b (S140). The first and second lower material layer patterns 137a and 137b may be formed to have top (or upper) surfaces at substantially the same level (or height) by the second etching process. The lower material layer 135 may be etched by about 1000 Å to 2000 Å by the first and second etching process to form the first and second lower material layer patterns 137a and 137b.

The second etching process may be a process in which an etch rate depends on widths of the first and second trench regions 120a and 120b due to a loading effect. The second etching process may be a process in which the first and second preliminary lower material layer patterns 136a and 136b may be etched without etching damage to the insulating liner 130 and the mask pattern 110. The second etching process may include a process in which the first and second preliminary lower material layer patterns 136a and 136b are reacted with an etchant to generate and remove a solid reaction product. Generating and removing the reaction product in the second etching process may be performed repeatedly. The reaction product may include ammonium hexafluorosilicate (($NH_4$)$_2SiF_6$). The second etching process may include etching the first and second preliminary lower material layer patterns 136a and 136b using vapor hydrofluoric acid (HF) as the etchant to generate and remove the solid reaction product. The solid reaction product may be removed by heating to a temperature above room temperature. The reaction product may be removed by a chemical solution. The reaction product may be removed in a temperature environment of 100° C. or more, or about 100° C. or more.

The second etching process may be performed using a catalyst with the etchant. The catalyst may include an ammonia ($NH_3$) gas. Because an etch rate depends on widths of the first and second trench regions 120a and 120b due to the reaction product according to a loading effect, the first preliminary lower material layer patterns 136a in the first trench region 120a may have an etch rate lower than the second preliminary lower material layer patterns 136b in the second trench region 120b, which has a larger width than the first trench region 120a.

Referring to FIGS. 1E and 3, an upper material layer 145 may be formed on the substrate having the first and second lower material layer patterns 137a and 137b. The upper material layer 145 may be formed of a material having a higher etch resistance than the first and second lower material layer patterns 137a and 137b. For example, if the first and second lower material layer patterns 137a and 137b are SOG layers, the upper material layer 145 may an HDP oxide layer.

Referring to FIGS. 1F and 3, the upper material layer 145 may be planarized to expose the mask pattern 110. As such, a first upper material layer pattern 145a may be formed on the first lower material layer pattern 137a in the first trench region 120a. A second upper material layer pattern 145b may be formed on the second lower material layer pattern 137b in the second trench region 120b. The first upper material layer pattern 145a may fill a remaining portion of the first trench region 120a on the first lower material layer pattern 137a. The second upper material layer pattern 145b may fill a remaining portion of the second trench region 120b on the second lower material layer pattern 137b (S150).

The mask pattern 110 and the pad insulating layer 105 may be removed to expose the active region 121 of the substrate 100. The first lower material layer pattern 137a and the first upper material layer pattern 145a sequentially stacked in the first trench region 120a may be formed. The second lower material layer pattern 137b and the second upper material layer pattern 145b sequentially stacked in the second trench region 120b may be formed.

The first and second lower material layer patterns 137a and 137b, in which have the top surfaces are at substantially the same level (or height) and which have desirable gap-fill characteristics, may be formed to fill the first and second trench regions 120a and 120b, respectively, having different widths. The first and second upper material layer patterns 145a and 145b may be formed to fill the remaining portions of the first and second trench regions 120a and 120b, respectively. The first and second upper material layer patterns 145a and 145b having a substantially uniform thickness may be formed of a material having a higher etch resistance than the first and second lower material layer patterns 137a and 137b. The first and second trench regions 120a and 120b may be filled with insulating layers without a void. Because the first and second upper material layer patterns 145a and 145b having a more uniform thickness and/or higher etch resistance are formed in upper portions of the first and second trench regions 120a and 120b, damage to the trench isolation regions may be prevented (or reduce) in subsequent processes. The subsequent processes may include etching processes performed to form a multi-gate dielectric layer of MOS transistors. If one of the first and second upper material layer patterns 145a and 145b has a relatively thin thickness, the upper material layer patterns 145a and 145b may be etched by the subsequent process. Lower material layer patterns 137a and 137b below the upper material layer patterns 145a and 145b having a substantially thin thickness may also be etched. Due to the first and second upper material layer patterns 145a and 145b having the more uniform thickness, partial etching damage to the trench isolation regions may be prevented (or reduced).

A method of fabricating a semiconductor device according to example embodiments will now be described with reference to FIGS. 2A and 2B.

Figure 2A:
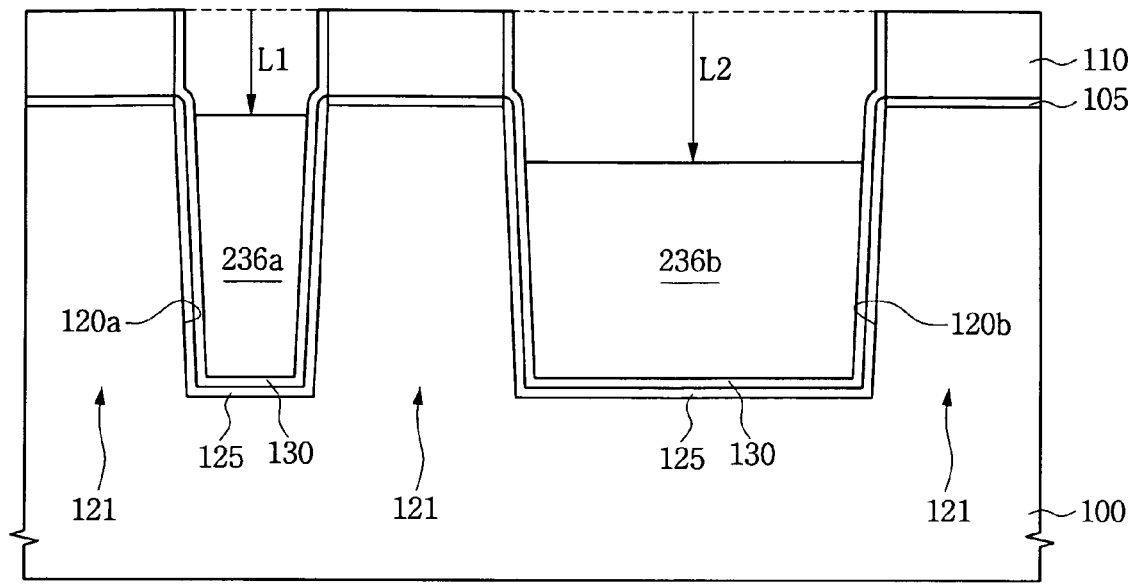
Figure 2B:
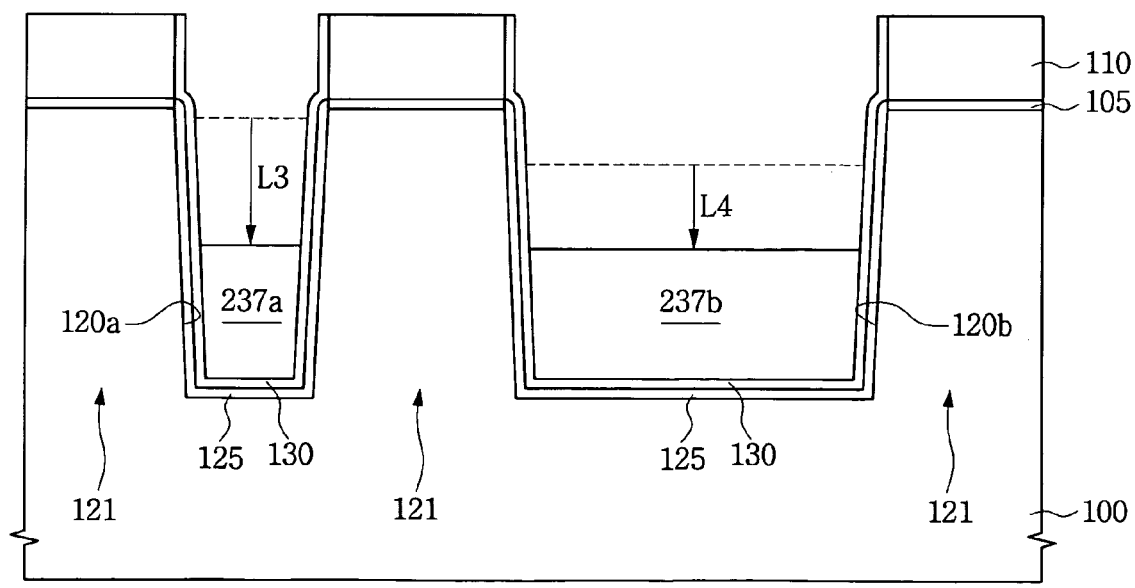

FIGS. 2A and 2B are diagrams illustrating cross-sectional views of a method of fabricating a semiconductor device according to example embodiments.

Referring to FIG. 2A, a substrate 100 having the first and second lower material layers 135a and 135b may be prepared using substantially the same method as described above with reference to FIGS. 1A and 1B.

The first lower material layer 135a may be partially etched by a first etching process to form a first preliminary lower material layer pattern 236a recessed by a first distance L1 from a top (or upper) surface of the mask pattern 110. The second lower material layer 135b may be partially etched by the first etching process to form a second preliminary lower material layer pattern 236b recessed by a second distance L2 from the top (or upper) surface of the mask pattern 110. The second distance L2 may be greater than the first distance L1. The first preliminary lower material layer pattern 236a having a top (or upper) surface at a higher level (or height) than the second preliminary lower material layer pattern 236b may be formed.

The first etching process may be a process in which an etch rate depends on widths of the first and second trench regions 120a and 120b due to a loading effect. The first etching process may be a process in which the first and second lower material layers 135a and 135b may be etched without etching damage to the insulating liner 130 and the mask pattern 110. The first etching process may include a process in which the first and second lower material layers 135a and 135b are reacted with an etchant to generate and remove a solid reaction product. Generating and removing the reaction product in the first etching process may be performed repeatedly. The reaction product may include ammonium hexafluorosilicate (($NH_4$)$_2SiF_6$). For example, the first etching process may include etching the first and second lower material layers 135a and 135b using vapor hydrofluoric acid (HF) as the etchant to generate and remove the solid reaction product.

The reaction product may be removed by heating to a temperature above room temperature. The reaction product may be removed by a chemical solution.

The first etching process may be performed using a catalyst with the etchant. The catalyst may include an ammonia ($NH_3$) gas. Because an etch rate depends on widths of the first and second trench regions 120a and 120b due to the reaction product according to a loading effect, the first lower material layer 135a in the first trench region 120a may have a lower etch rate than the second lower material layer 135b in the second trench region 120b, which has a larger width than the first trench region 120a.

Referring to FIG. 2B, the first preliminary lower material layer pattern 236a (shown in FIG. 2A) may be partially etched by a second etching process to form a first lower material layer pattern 237a recessed by a third distance L3 from a top surface of the first preliminary lower material layer pattern 236a. The second preliminary lower material layer pattern 236b (shown in FIG. 2A) may be partially etched by the second etching process to form a second lower material layer pattern 237b recessed by a fourth distance L4 from the top surface of the second preliminary lower material layer pattern 236b. The fourth distance L4 may be less than the third distance L3. The first and second lower material layer patterns 237a and 237b having top surfaces at substantially the same level (or height) may be formed. The second etching process may be performed using a liquid etchant. The second etching process may be a process of etching the first and second lower material layer patterns 237a and 237b without etching damage to the insulating liner 130 and the mask pattern 110. The second etching process may be a wet etching process using a buffered oxide etchant (BOE) or a diluted hydrofluoric acid (HF) etching solution.

The first and second lower material layer patterns 237a and 237b, which are substantially the same as the first and second lower material layer patterns 137a and 137b shown in FIG. 1D, may be formed. Although not shown in the figures, a first upper material layer pattern (e.g., first upper material layer pattern 145a shown in FIG. 1F) may be formed on the first lower material layer pattern 237a in the first trench region 120a. A second upper material layer pattern (e.g., second upper material layer pattern 145b shown in FIG. 1F) may be formed on the second lower material layer pattern 237b in the second trench region 120b, using the method described above with reference to FIGS. 1E and 1F.

According to example embodiment, lower material layer patterns having top (or upper) surfaces at the same level (or height) may be formed to partially fill trench regions having different widths. Upper material layer patterns may be formed to fill remaining portions of the trench regions. The upper material layer patterns having a more uniform thickness regardless of widths of the trench regions and/or having a higher etch resistance than the lower material layer patterns may be formed. The trench regions may be filled with an insulating material layer without a void. Because the upper material layer patterns having a more uniform thickness are formed in upper portions of the trench regions, etching damage to the trench isolation regions may be prevented (or reduced) in subsequent processes, regardless of the widths of the trench regions.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of fabricating a semiconductor device, comprising:
    forming a first trench region and a second trench region in a substrate, the second trench region having a larger width than the first trench region;
    forming a lower material layer filling the first and second trench regions;
    forming a first preliminary lower material layer pattern in the first trench region and a second preliminary lower material layer pattern in the second trench region by etching the lower material layer using a first etching process, a top surface of the second preliminary lower material layer pattern being at a different height than the first preliminary lower material layer pattern;
    forming first and second lower material layer patterns by etching the first and second preliminary lower material layer patterns, respectively, using a second etching process, an upper surface of the first lower material layer pattern being at substantially the same height as an upper surface of the second lower material layer pattern; and
    forming first and second upper material layer patterns on the first and second lower material layer patterns, respectively.

2. The method according to claim 1, wherein forming the lower material layer includes:
    forming a flowable material layer on the substrate having the first and second trench regions, and
    curing the flowable material layer.

3. The method according to claim 1, wherein the lower material layer is formed of a spin-on-glass (SOG) layer or a flowable chemical vapor deposition (CVD) oxide layer.

4. The method according to claim 1, wherein the lower material layer in the second trench region has a denser layer structure than the lower material layer in the first trench region.

5. The method according to claim 1, wherein the lower material layer in the first trench region has a higher etch rate than the lower material layer in the second trench region in the first etching process.

6. The method according to claim 4, wherein the first etching process is a wet etching process.

7. The method according to claim 5, wherein the second preliminary lower material layer pattern has a higher etch rate than the first preliminary lower material layer pattern in the second etching process.

8. The method according to claim 5, wherein using the second etching process includes generating and removing a solid reaction product by reacting the first and second preliminary lower material layer patterns with a first etchant.

9. The method according to claim 8, wherein the second etching process is performed repeatedly.

10. The method according to claim 8, wherein removing the reaction product includes heating to a temperature above room temperature or using a chemical solution.

11. The method according to claim 8, wherein the first etchant includes vapor hydrofluoric acid (HF).

12. The method according to claim 8, wherein the second etching process includes using a first catalyst with the first etchant, the first catalyst including an ammonia gas.

13. The method according to claim 1, wherein the lower material layer in the second trench region has a higher etch rate than the lower material layer in the first trench region in the first etching process.

14. The method according to claim 13, wherein using the first etching process includes generating and removing a solid reaction product by reacting the lower material layer with a second etchant.

15. The method according to claim 14, wherein the first etching process is performed repeatedly.

16. The method according to claim 14, wherein removing the reaction product includes heating the reaction product to a temperature above room temperature or using a chemical solution.

17. The method according to claim 14, wherein the second etchant includes vapor hydrofluoric acid (HF).

18. The method according to claim 14, wherein the first etching process includes using a second catalyst with the second etchant, the second catalyst including ammonia gas.

19. The method according to claim 13, wherein the first preliminary lower material layer pattern has a higher etch rate than the second preliminary lower material layer pattern in the second etching process.

20. The method according to claim 19, wherein the second etching process is a wet etching process.

21. The method according to claim 1, further comprising forming an insulating liner on each inner wall of the first and second trench regions, after forming the first and second trench regions and prior to forming the lower material layer.

22. The method according to claim 1, wherein the first and second upper material layer patterns are formed of a material having a denser layer structure than the first and second lower material layer patterns.

23. The method according to claim 1, wherein the first and second upper material layer patterns are formed of a material having a higher etch resistance than the lower material layer.

* * * * *